United States Patent [19]

Hokari

[11] Patent Number: 5,514,887

[45] Date of Patent: May 7, 1996

[54] SOLID STATE IMAGE SENSOR HAVING A HIGH PHOTOELECTRIC CONVERSION EFFICIENCY

[75] Inventor: Yasuaki Hokari, Tokyo, Japan

[73] Assignee: NEC Corporation, Tokyo, Japan

[21] Appl. No.: 352,631

[22] Filed: Dec. 9, 1994

[30] Foreign Application Priority Data

Dec. 9, 1993 [JP] Japan .................................. 5-308947

[51] Int. Cl.$^6$ .......................... H01L 29/78; H01L 29/66
[52] U.S. Cl. .......................... 257/222; 257/223; 257/225; 257/233
[58] Field of Search .................................. 257/225, 233, 257/223, 222, 224, 229, 230, 243

[56] References Cited

FOREIGN PATENT DOCUMENTS

| | | |
|---|---|---|
| 62-181465 | 8/1987 | Japan . |
| 3-289173 | 12/1991 | Japan .................................. 257/233 |
| 4-176171 | 6/1992 | Japan .................................. 257/233 |
| 4-245479 | 9/1992 | Japan . |
| 5-75089 | 3/1993 | Japan . |

Primary Examiner—Donald L. Monin, Jr.
Attorney, Agent, or Firm—Popham, Haik, Schnobrich & Kaufman, Ltd.

[57] ABSTRACT

In a solid state image sensor comprising a first impurity layer of a first conductivity type forming a photodiode, the impurity layer is composed of a first impurity region formed of a low concentration at a deep level, and a second impurity region formed of a high concentration at a shallow level. The first impurity region extends under a second impurity layer of a second conductivity type formed for device isolation, and also extends under a gate region of a transistor for transferring an electric charge from the photodiode to a CCD channel.

6 Claims, 10 Drawing Sheets

SOLID STATE IMAGE SENSOR HAVING A HIGH PHOTOELECTRIC CONVERSION EFFICIENCY

BACKGROUND OF THE INVENTION

1. Field of the Invention

The present invention relates to a two-dimensional solid state image sensor of a CCD (charge coupled device) type, and more specifically to a solid state image sensor configured to suppress a smear charge mixed into a vertical CCD channel and to elevate a photoelectric conversion efficiency.

2. Description of Related Art

Figure 1:
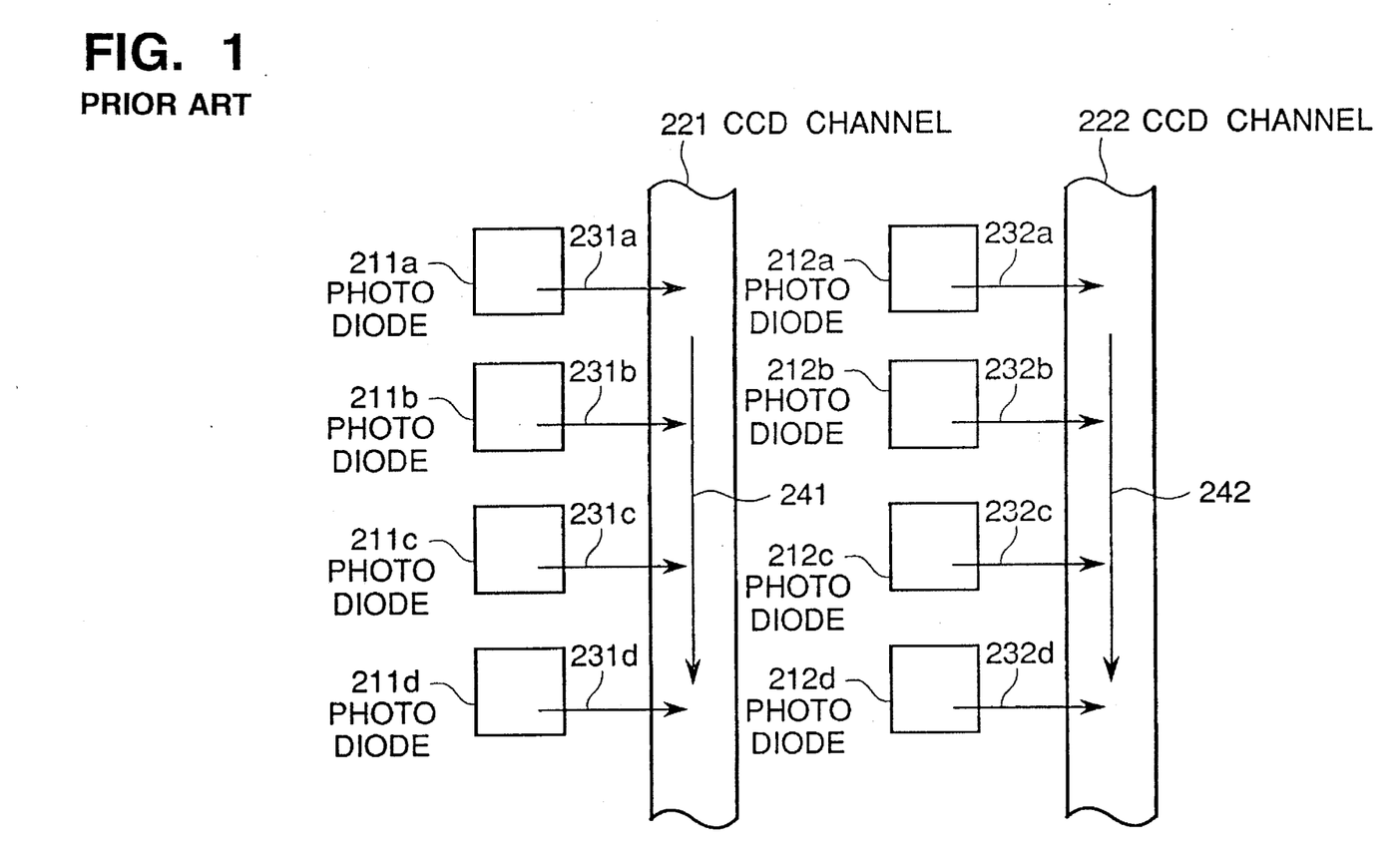
FIG. 1 is a partial layout diagram illustrating a conventional solid state image sensor.

Referring to FIG. 1, there is shown a partial layout diagram illustrating a conventional solid state image sensor. In FIG. 1, Reference Numeral 211a, 211b, 211c, 211d and 212a, 212b, 212c, 212d designate a photodiode for a photoelectric conversion, and Reference Numeral 221 and 222 indicate a CCD channel for transferring a received electric charge.

This solid state image sensor operates as follows: Electric charges of the amount corresponding to a light intensity of a light pattern projected on the solid state image sensor, are accumulated in the photodiodes 211a, 211b, 211c, 211d and 212a, 212b, 212c, 212d. After lapse of a predetermined period of time, the electric charges accumulated in the photodiodes 211a to 211d and 212a to 212d are simultaneously transferred into the channels 221 and 222, respectively, as shown in arrows 231a, 231b, 231c, 231d and 232a, 232b, 232c, 232d. Succeedingly, the electric charges transferred in the channels 221 and 222 are sequentially transferred in the channels 221 and 222, respectively as shown by arrows 241 and 242.

Figure 2:
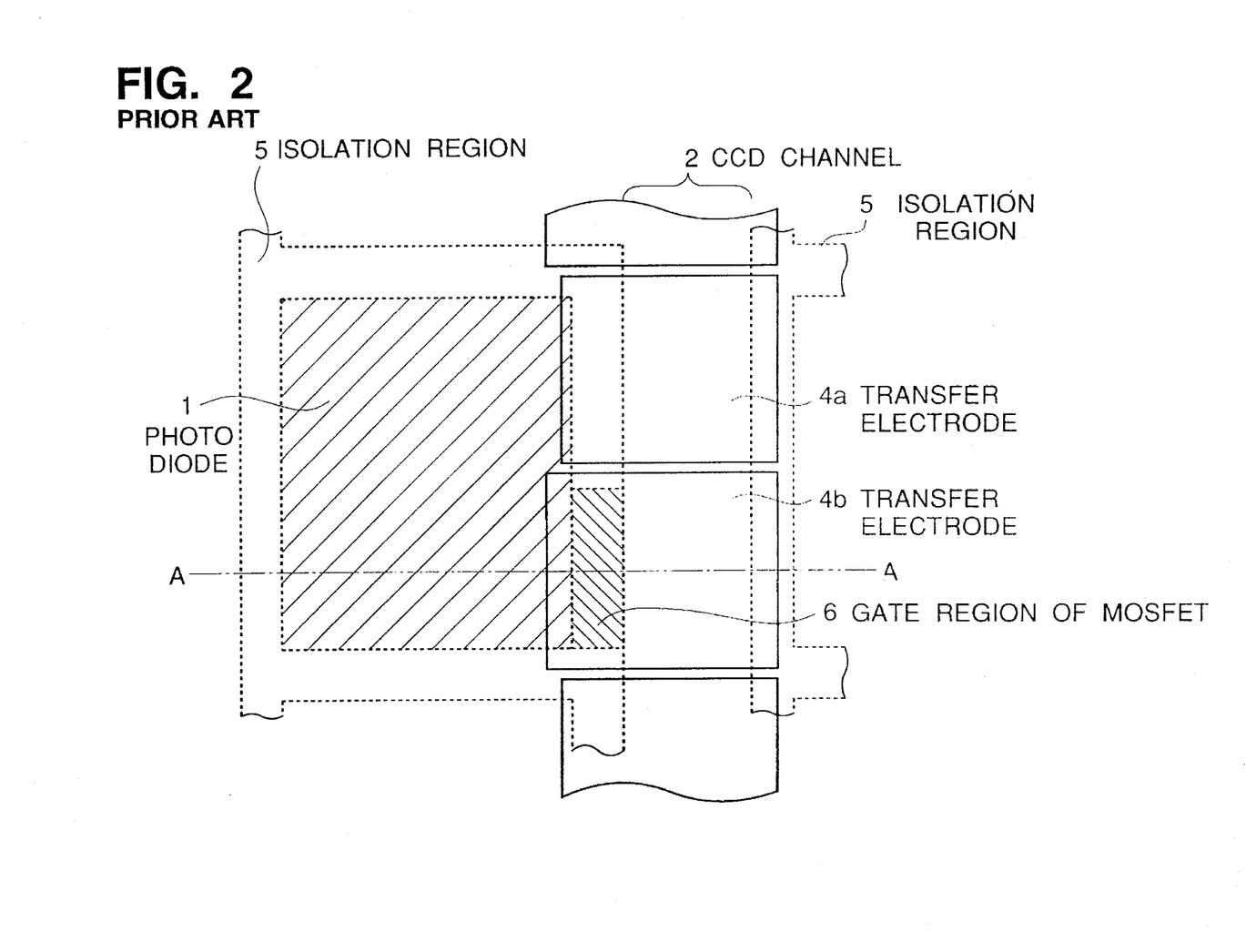
FIG. 2 is a partial enlarged layout pattern diagram illustrating a conventional structure including one photodiode and the CCD channel.

Referring to FIG. 2, there is shown a partial enlarged layout pattern diagram illustrating a conventional structure including one photodiode and the CCD channel. In FIG. 2, Reference Numeral 1 designates a photodiode, and Reference Numeral 2 indicates a CCD channel. Reference Numerals 4a and 4b show one pair of transfer electrodes, and Reference Numeral 5 depicts an isolation region. Reference Numeral 6 designates a gate region of a MOS transistor (metal-oxide-semiconductor field effect transistor).

The photodiode 1 is indicated by a hatched zone, and is isolated from the CCD channel 2 by the isolation region 5 and the gate region 6 also shown by a hatched zone. By applying a voltage pulse to the electrode 4b, the electric charge stored in the photodiode 1 is transferred or read out to the CCD channel 2. Thereafter, the electric charge transferred into a region under the electrode 4b is transferred in and through the CCD channel 2, by applying pulse voltages having different phases, to the transfer electrodes 4a and 4b.

Figure 3:
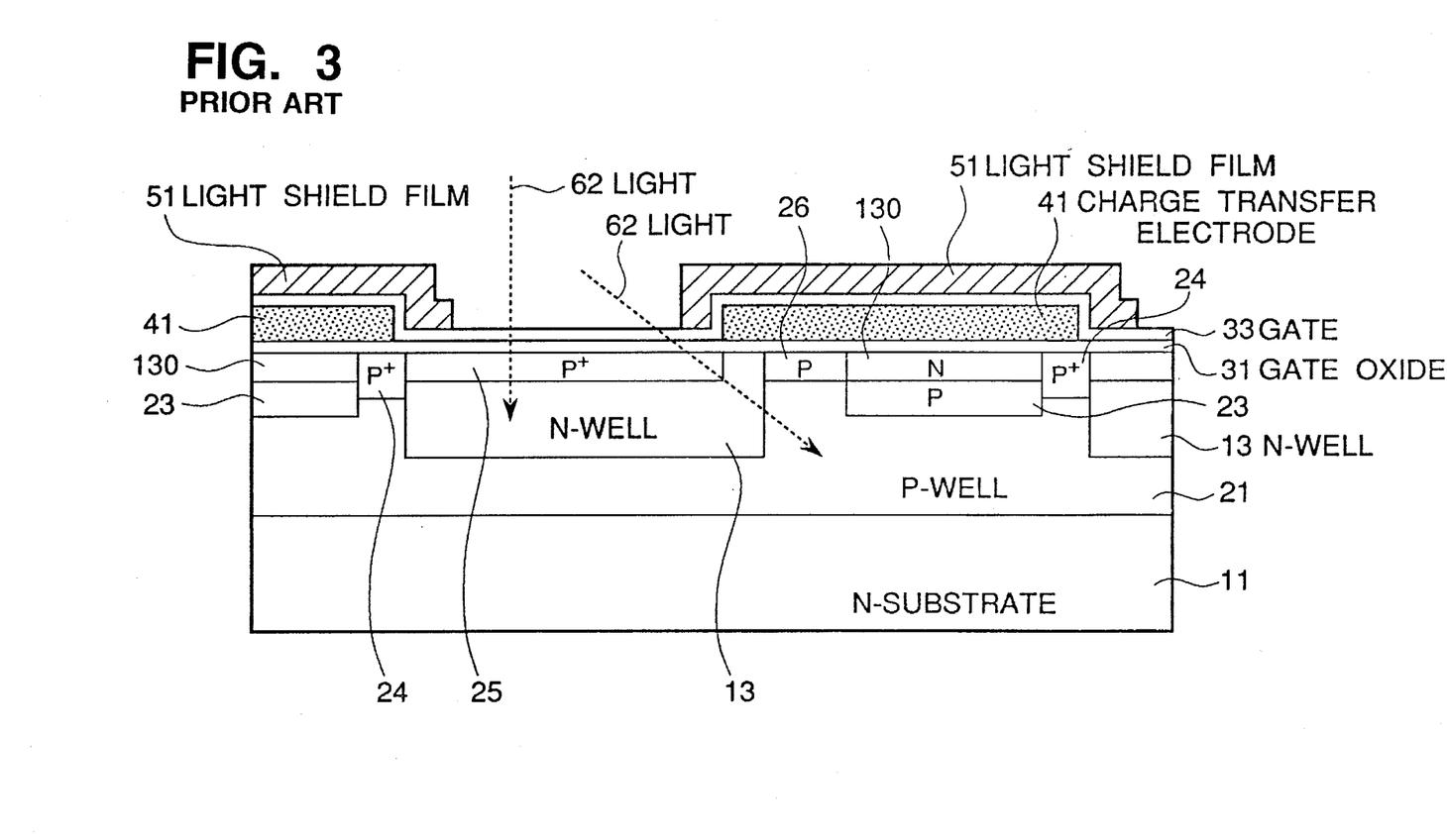
FIG. 3 is a diagrammatic sectional view taken along the line A—A in FIG. 2.

Referring to FIG. 3, there is shown a diagrammatic sectional view taken along the line A—A in FIG. 2. In FIG. 3, Reference Numeral 11 designates an N-type semiconductor substrate, on which a P-type well 21 is formed. In the P-well 21, an N-type impurity region 13 is formed for the photodiode, and a P-type impurity region 23 is formed separately from the N-type impurity region 13. On the P-type impurity region 23, another N-type impurity region 130 is formed for the CCD channel. A high concentration P-type impurity region 24 is formed for device isolation between the photodiode and the CCD channel. In addition, another high concentration P-type impurity region 25 is formed on a surface of the photodiode 13 so as to suppress a current which occurs at a Si/SiO$_2$ boundary. A P-type impurity region 26 is formed between the photodiode and the CCD channel so as to form a path through which the electric charge is transferred to the CCD channel.

The upper surface of the substrate is covered with an insulating film 31, and a charge transfer electrode 41 formed of polysilicon is located on the insulating film 31 to extend from end of the N-type impurity region 13 over the P-type impurity region 26 and the N-type impurity region 130 to reach on a portion of the high concentration P-type impurity region 24. An interlayer insulating film 51 is formed to cover a whole surface, and a light shield film 51 is formed to cover the transfer electrode 41 for the purpose of preventing light from entering the CCD channel.

Reference Numerals 61 and 62 designate a light ray.

In the structure shown in FIG. 3, a PN junction photodiode is constituted of the N-type impurity region 13 and the P-well 21. The incident light 61 entering to the N-type impurity region 13 is photoelectrically converted, and electrons generated by the photoelectric conversion are accumulated in the N-type impurity region 13.

The electrode 41, the N-type impurity region 13 and the CCD channel 130 constitute a gate, a source and a drain of a MOS transistor, respectively. By applying a voltage pulse of 10 V to 15 V to the electrode 41, the electrons accumulated in the photodiode 13 is transferred to the CCD channel 130. Thereafter, by applying a voltage pulse of −5 V to −10 V to the electrode 41, the electrons are transferred in the CCD channel in a vertical direction, which is perpendicular to the plane of the drawing.

The inclined incident light 62 reaches the P-well 21 in proximity of the CCD channel, where electric changes are generated. Electrons of the generated electric changes flows into the CCD channel 130, so that a so called spurious signal (smear phenomenon) is generated. The fact that the electric charges generated by the photoelectric conversion flows into an area other than the photodiode, results in a lowering of an electric charge collecting efficiency in the photodiode, namely, results in a drop of sensitivity.

Figure 4:
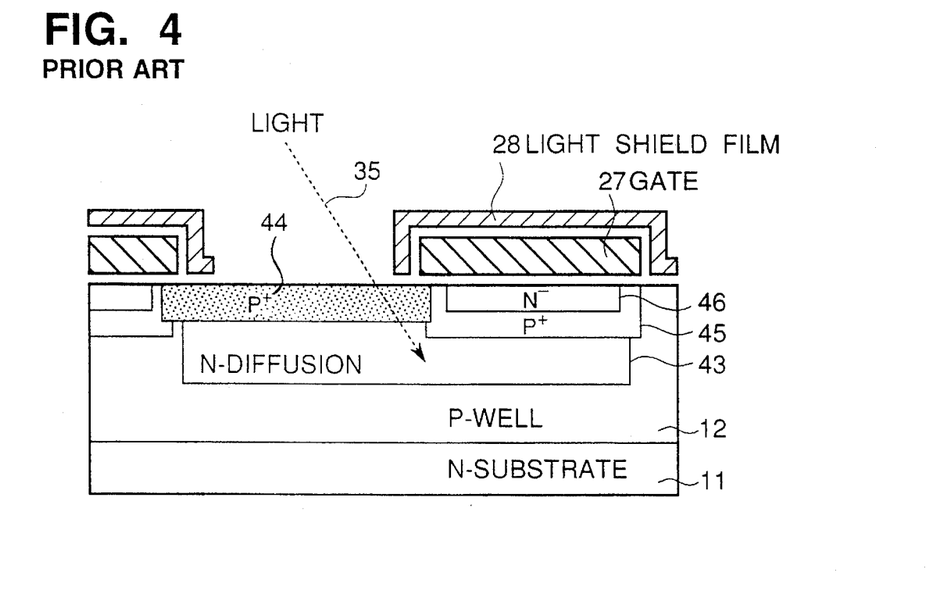
FIG. 4 is a diagrammatic sectional view of a first conventional example of the solid state image sensor having the structure for preventing the lowering of the electric charge collecting efficiency and the drop of the sensitivity.

Japanese Patent Application Laid-open Publication JP-A-5-075089 proposes one conventional approach for solving the above mention problem. FIG. 4 is a sectional view shown in JP-A-5-075089, but Reference Numerals used in FIG. 4 are different from those used in the sectional view shown in JP-A-5-075089.

In FIG. 4, Reference Numeral 11 designates a N-type substrate, Reference Numeral 12 shows a P-well diffusion layer. Reference Numeral 27 is a gate electrode, and Reference Numeral 28 indicates a light shield film. Reference Numeral 35 designates a inclined incident light. Reference Numeral 43 shows an N-type diffusion layer forming a photodiode. Reference Numerals 44 and 45 indicate a high concentration P-type diffusion layer. Reference Numeral 46 designates an N-type diffusion layer constituting the CCD channel.

In this conventional example, the N-type diffusion layer 43 forming the photodiode, extends under the N-type diffusion layer 46 constituting the CCD channel, with the P-type diffusion layer 45 being interposed between the N-type diffusion layer 43 and the N-type diffusion layer 46. Therefore, even if the inclined incident light enters, the photoelectric conversion occurs in the inside of the N-type diffusion layer 43. Accordingly, most of generated electrons are accumulated in this N-type diffusion layer 43. Namely, the electrons little flow into the CCD channel 46, and therefore, the smear phenomenon is greatly suppressed.

In this conventional example, furthermore, since the high concentration P-type diffusion layer 44 is formed to cover the whole surface of the photodiode 43, there is no area in which the photodiode is in contact with an oxide film. Accordingly, a current occurring at the Si/SiO$_2$ boundary is negligible.

Figure 5:
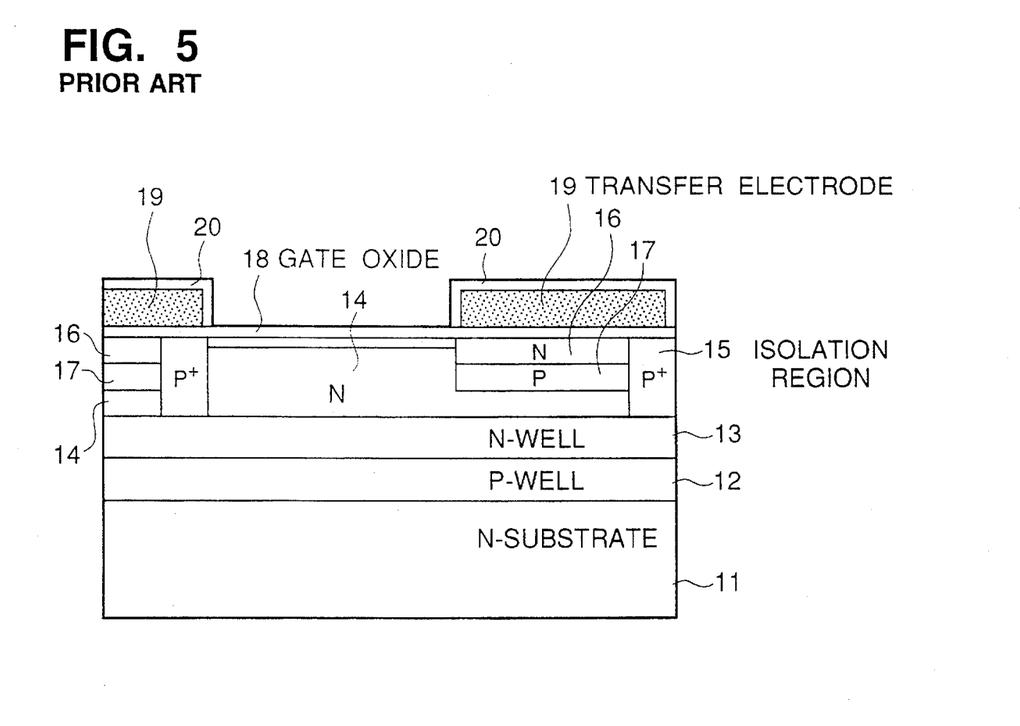
FIG. 5 is a diagrammatic sectional view of a second conventional example of the solid state image sensor having the structure for preventing the lowering of the electric charge collecting efficiency and the drop of the sensitivity.

Japanese Patent Application Laid-Open Publication JP-A-4-245479 proposes another conventional approach for reducing the smear phenomenon and elevating the sensitivity. FIG. 5 is a sectional view shown in JJP-A-4-245479.

In FIG. 5, Reference Numeral 11 designates a N-type substrate, Reference Numeral 12 shows a P-well. Reference Numeral 13 indicates an N-well, and Reference Numeral 14 shows an N-type impurity region. Reference Numeral 15 is a high concentration P-type impurity region for device isolation. Reference Numeral 16 designates an N-type diffusion layer constituting the CCD channel. Reference Numeral 17 is a second P-well, and Reference Numeral 18 shows a gate insulating film. Reference Numeral 19 designates a charge transfer electrode, and Reference Numeral 20 indicates an insulating film.

In this second conventional example, a photodiode is constituted of the N-type impurity region 14 and the N-well 13, and the photodiode extends under the CCD channel 16, with the P-well 17 being interposed between the CCD channel 16 and the photodiode. Accordingly, even if the inclined incident light enters, the photoelectric conversion occurs in the inside of the photodiode. Accordingly, the electrons little flow into the CCD channel 16, and therefore, the smear phenomenon is greatly suppressed.

Figure 6:
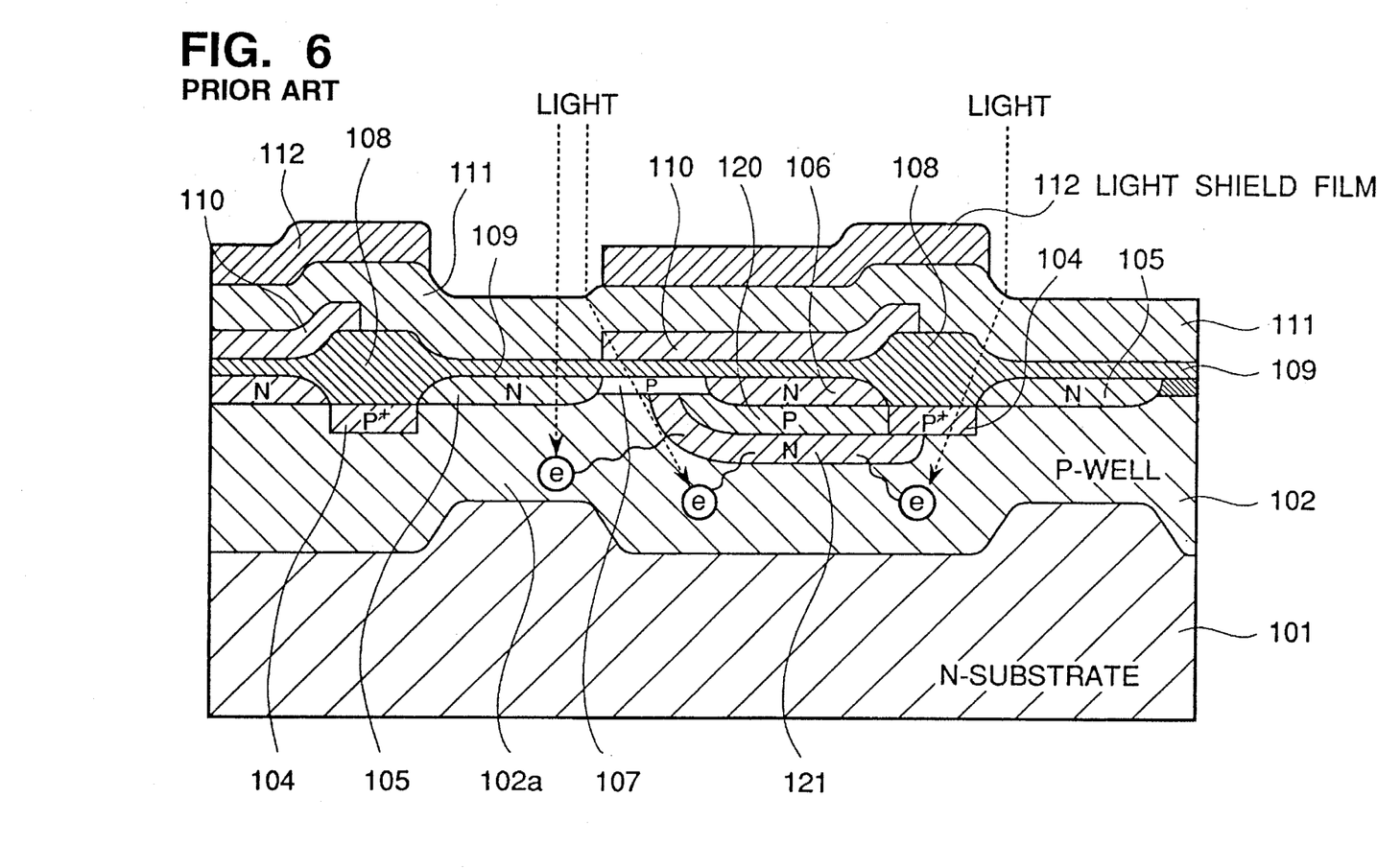
FIG. 6 is a diagrammatic sectional view of a third conventional example of the solid state image sensor having the structure for preventing the lowering of the electric charge collecting efficiency and the drop of the sensitivity.

Still another conventional example in which a photodiode region extends under a CCD channel with a P-type impurity layer being interposed between the photodiode region and the CCD channel, is disclosed in Japanese Patent Application Laid-open Publication JP-A-62-181465. FIG. 6 is a sectional view shown in JJP-A-62-181465, but Reference Numerals used in FIG. 6 are different from those used in the sectional view shown in JP-A-62-181465.

In FIG. 6, Reference Numeral 101 designates a N-type substrate, Reference Numeral 102 shows a P-well. Reference Numeral 104 is a high concentration P-type impurity region for device isolation. Reference Numeral 105 shows an N-type diffusion layer forming a photoreceptor. Reference Numeral 106 designates an N-type diffusion layer constituting the CCD channel. Reference Numeral 107 is a P-type region constituting the transfer gate region. Reference Numerals 108, 109 and 111 show an insulating film. Reference Numeral 110 designates a polysilicon electrode, and Reference Numeral 112 indicates a light shield film. Reference Numeral 120 shows a P-type diffusion layer, and Reference Numeral 121 is an N-type diffusion layer.

In this third conventional example, the N-type diffusion layer 105 is formed as the photoreceptor, and the N-type diffusion layer 121 is formed under the CCD channel 106 with the P-type diffusion layer 120 being interposed between the N-type diffusion layer 121 and the CCD channel 106. Electrons generated by light leaked into the inside of the P-well 102, are accumulated in the N-type diffusion layer 121, and therefore, flows into the CCD channel 106. Accordingly, the smear phenomenon is suppressed.

In the third conventional example, furthermore, the electrons accumulated in the N-type diffusion layer 121 is transferred to the CCD channel 16 at the same time as the electrons stored in the photorecepting region 105 is transferred or read out to the CCD channel 16, so that the electrons accumulated in the N-type diffusion layer 121 is mixed with the electrons stored in the photorecepting region 105. Thus, the smear phenomenon is reduced, and the sensitivity is elevated.

Figure 7:
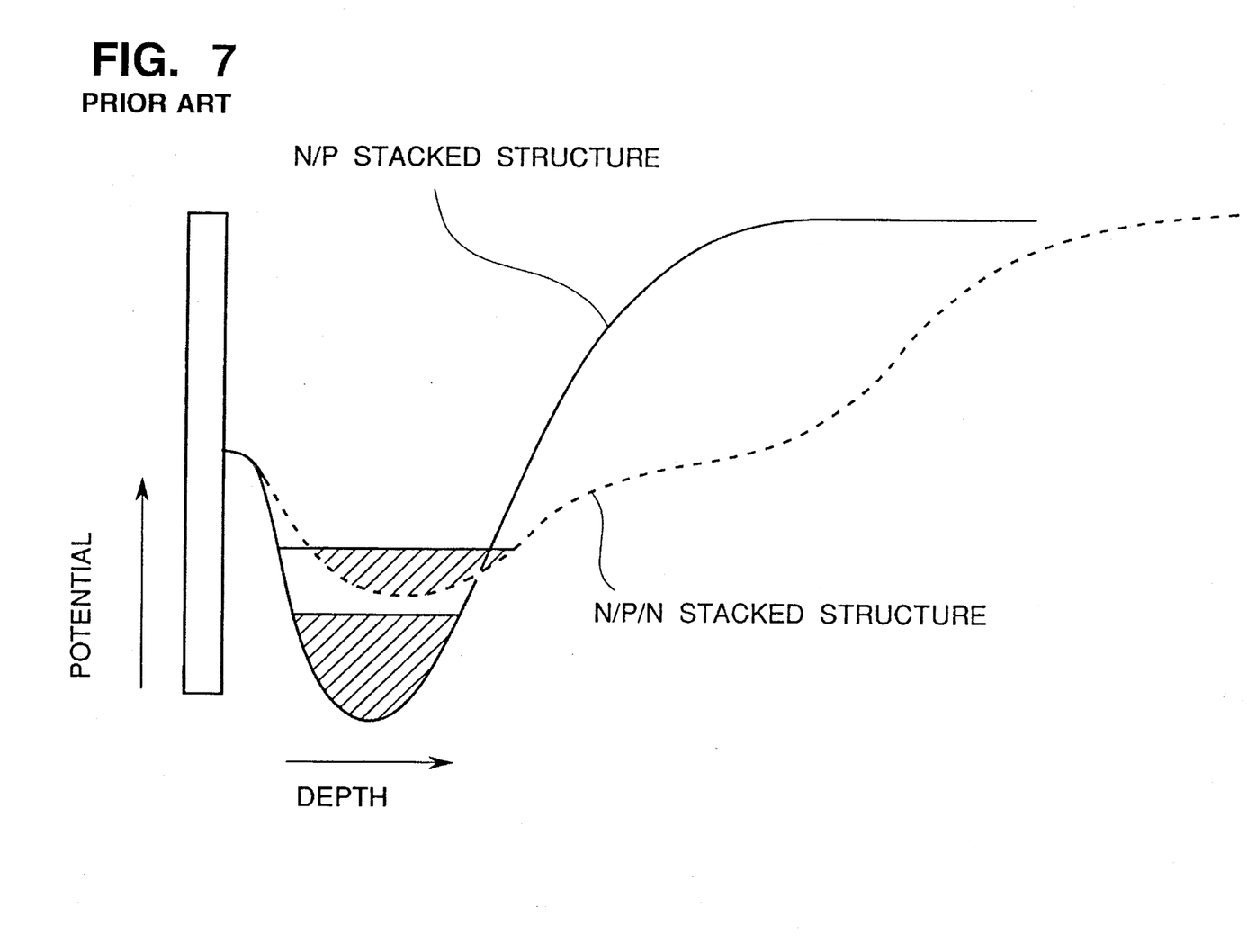
FIG. 7 is a potential diagram of the stacked structure.

In the conventional example shown in FIG. 4, when the electrons are transferred to the CCD channel, a voltage pulse is applied to the gate electrode 27 while maintaining the P-well diffusion layer 12 at a ground level. At this time, since the high concentration P-type diffusion layer 45 and the N-type diffusion layer 43 are stacked under the N-type diffusion layer 46 constituting the CCD channel, a voltage is divided in the N-type diffusion layer 43, as an example of the N/P/N stacked structure in the potential diagram of FIG. 7, and therefore, a voltage applied to the N-type diffusion layer 46 (constituting the CCD channel) lowers. This causes to drop the maximum amount of electric charges which can be transferred to the CCD channel, and furthermore, since an electric charge in a transfer direction lowers, the charge transfer becomes defective.

In order to overcome this disadvantage, it may be considered to set the concentration of the P-type diffusion layer 45 to a sufficiently high value so as to prevent this impurity layer from being depleted. The high concentration leads to increase the depth of the diffusion layer, with the result that the depth of the diffusion layer becomes equal to the depth of the N-type diffusion layer 43 constituting the photodiode. Because of this, a desired structure would not be obtained. As another approach of overcoming the above mentioned disadvantage, it may be considered to apply a higher voltage to the gate electrode. This second approach makes the circuit construction complicated, and increases a consumed electric power.

In the conventional example shown in FIG. 4, since the upper surface of the N-type diffusion layer is covered with the high concentration P-type diffusion layer 44. Because of this, the charge transfer from the N-type diffusion layer 43 (constituting the photodiode) to the CCD channel 46 is different from operation of an ordinary surface channel type MOS transistor, but is realized by a punch-through operation through the high concentration P-type diffusion layer. This punch-through operation is controlled by the voltage applied to the electrode 27 as a matter of course, and also, the characteristics of this punch-through operation is a function of the concentration and the thickness of the high concentration P-type diffusion layer 45 and the concentration of the N-type diffusion layer 43 and the CCD channel 46. In other words, it is necessary to set these parameters to optimum values.

However, it is required to fulfill all of a first condition that the amount of electric charges transferred to the CCD channel is made maximum so that a defective charge does not occur, and a second condition in which the electrons accumulated in the photodiode are completely transferred to the CCD channel so as to prevent the electrons from remaining in the photodiode, thereby preventing an afterimage or persistence. In addition, it is very difficult to control the punch-through operation in a range of a voltage that can be applied to the electrode 27.

In the conventional example shown in FIG. 5, since the photodiode is constituted of the N-type impurity region 14 and the N-well region 13, and the photodiode extends under the N-type impurity layer 16 constituting the CCD channel. Accordingly, the voltage applied to the CCD channel drops, similarly to the conventional example shown in FIG. 4, and therefore, the maximum transferred charge amount is lowered. In addition, since an electric charge in a transfer direction lowers, the charge transfer becomes defective.

In the conventional example shown in FIG. 5, furthermore, since the N-well 13 extends under the P-type region 15 that isolates the photodiodes from one another, the isolation between the photodiodes is not sufficient, so that when a photodiode accumulating a sufficient amount of electrons is adjacent to an empty photodiode, the electron leaks into the empty diode. In addition, the N-type impurity region 14 (constituting the photodiode) is in contact with the N-type impurity region 16 (constituting the CCD channel), both the regions cannot be electrically isolated from each other. This is a fatal defect.

The conventional example shown in FIG. 6 is such that the P-type diffusion layer 120 and the N-type diffusion layer 121 are formed to extend under the CCD channel 106. Accordingly, the voltage applied to the CCD channel drops as mentioned above, and therefore, the maximum transferred charge amount is lowered. In addition, since an electric charge in a transfer direction lowers, the charge transfer becomes defective. In particular, since the electrons are accumulated in the N-type diffusion layer 121, the electric field applied to the CCD channel is modulated in accordance with the amount of the accumulated electrons. Accordingly, it is extremely difficult to set a manufacturing condition and an operating condition.

Furthermore, the conventional example shown in FIG. 6 has a fatal defect in which a blooming cannot be controlled with respect to an incident light having a high intensity. The blooming is a phenomenon in which electrons overflow from the photodiode to extend and enter into adjacent pixels. In the prior art, in order to prevent this disadvantage, it is a conventional approach to bias between the N-type substrate 101 and the P-well 102, so that before the electrons accumulated in the photodiode 105 leak or flow out to a surrounding region, the electrons accumulated in the photodiode 105 are extracted or drawn out through a thin region 102a of the P-well. Under this approach for suppressing the blooming, the electrons accumulated in the photodiode 105 are controlled, but the electrons are accumulated in the N-type diffusion layer 121 and cannot be controlled at all. This remarkably deteriorates quality of the image.

SUMMARY OF THE INVENTION

Accordingly, it is an object of the present invention to provide a solid state image sensor which has overcome the above mentioned defects of the conventional ones.

Another object of the present invention is to provide a solid state image sensor capable of elevating the electric charge collecting efficiency of the photodiode and therefore reducing the amount of electrons leaking into the CCD channel, without influencing the charge transfer amount in the CCD channel.

The above and other objects of the present invention are achieved in accordance with the present invention by a solid state image sensor comprising a first impurity layer of a first conductivity type forming a photodiode, the impurity layer being composed of a first impurity region of a low concentration formed at a deep level, and a second impurity region of a high concentration formed at a shallow level, the first impurity region being formed to extend under a second impurity layer of a second conductivity type formed for device isolation, and also to extend under a gate region of a transistor for transferring an electric charge from the photodiode to a CCD channel.

In one embodiment, the first impurity layer has an impurity concentration higher lower than that of the second impurity layer.

Furthermore, the second impurity region is formed of a first impurity diffusion region of a low concentration formed at a deep level, and a second impurity diffusion region of a high concentration formed at a shallow level.

In addition, an impurity layer controlling a threshold of the transistor for transferring the electric charge from the photodiode to the CCD channel, is formed of a first impurity region of a high concentration formed at a deep level, and a second impurity region of a low concentration formed at a shallow level.

The above and other objects, features and advantages of the present invention will be apparent from the following description of preferred embodiments of the invention with reference to the accompanying drawings.

DESCRIPTION OF THE PREFERRED EMBODIMENTS

Figure 8:
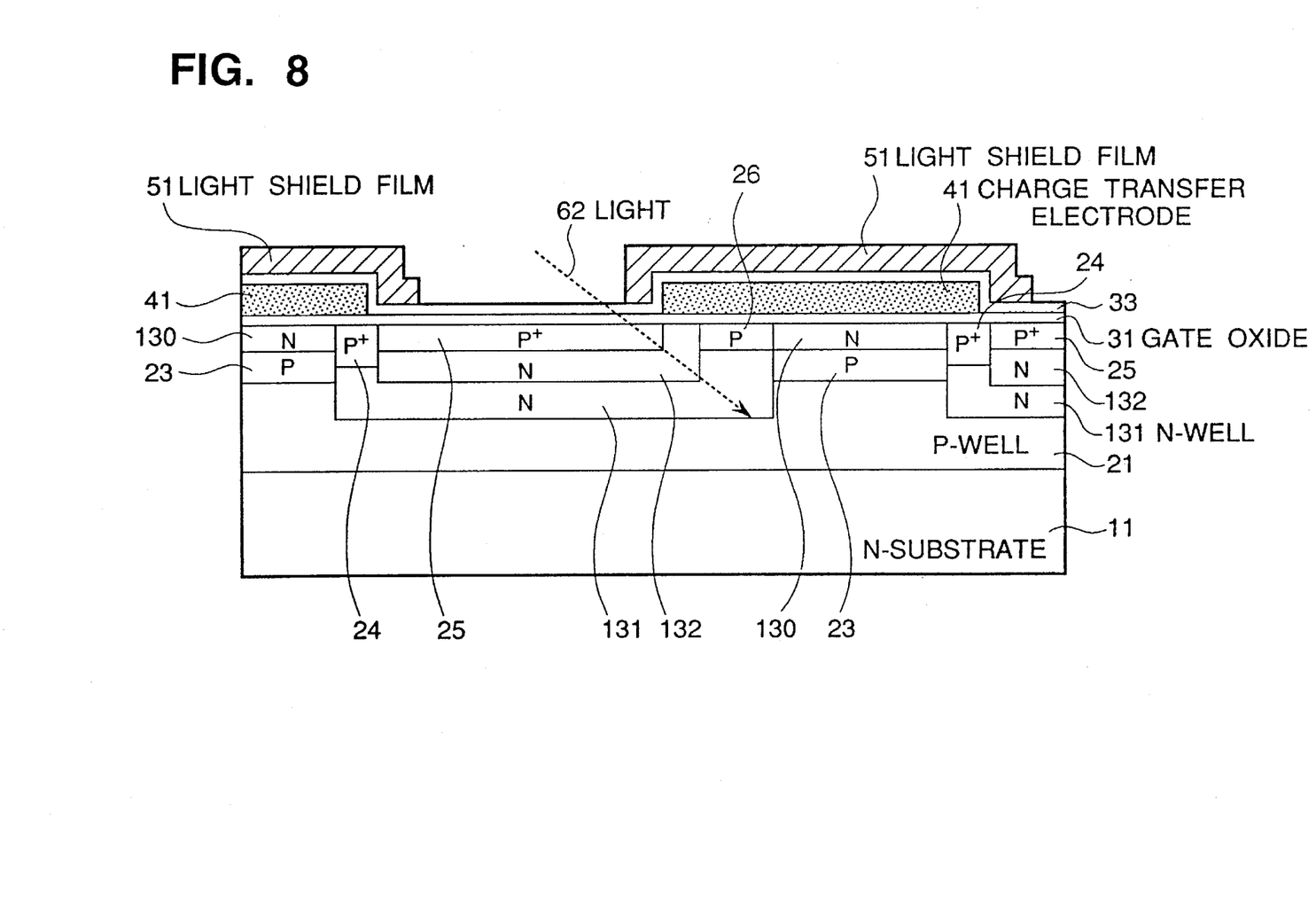
FIG. 8 is a diagrammatic sectional view taken along the line B—B in FIG. 9, illustrating a first embodiment of the solid state image sensor in accordance with the present invention.

Referring to FIG. 8, there is shown a diagrammatic sectional view of a first embodiment of the solid state image sensor in accordance with the present invention.

In FIG. 8, Reference Numeral 11 designates an N-type semiconductor substrate, on which a P-type well 21 is formed. In the P-well 21, an N-type impurity region 131 is formed for the photodiode, and also, a second N-type impurity region 132 is formed on the N-type impurity region 131. A P-type impurity region 23 is formed adjacent to the N-type impurity region 131. On the P-type impurity region 23, an N-type impurity region 130 is formed to form the CCD channel. A high concentration P-type impurity region 24 is formed at one end of the N-type impurity region 131 for device isolation between the photodiode and the CCD channel. In addition, another high concentration P-type impurity region 25 is formed on a surface of the second N-type impurity region 132 so as to suppress a current which occurs at a Si/SiO$_2$ boundary. A P-type impurity region 26 is formed at the other end of the N-type impurity region 131 between the photodiode and the CCD channel so as to form a path through which the electric charge is transferred to the CCD channel.

The upper surface of the substrate is covered with an insulating film 31, and a charge transfer electrode 41 formed of polysilicon is located on the insulating film 31 to extend from end of the N-type impurity region 132 over the P-type impurity region 26 and the N-type impurity region 130 to reach on a portion of the high concentration P-type impurity region 24. An interlayer insulating film 51 is formed to cover a whole surface, and a light shield film 51 is formed to cover the transfer electrode 41 for the purpose of preventing light from entering the CCD channel. Reference Numeral 62 designates a light ray.

In the embodiment shown in FIG. 8, a photodiode is constituted of the first N-type impurity layer 131 of a low concentration formed at a depth region and the second N-type impurity layer 132 of a relatively high concentration formed at a shallow region. The first N-type impurity layer 131 extends under a gate region (P-type impurity region 26) of the MOS transistor and also under the high concentration P-type impurity region 24. In addition, the thickness of the P-type impurity layer 23 is set or adjusted to ensure that the first N-type impurity layer 131 is never in contact with the CCD channel 130. Furthermore, the impurity concentration of the first N-type impurity layer 131 is lower than that of the second N-type impurity layer 132, in order to form a potential gradient which makes it possible to completely transfer or read out the electrons from the photodiode to the CCD channel.

In the construction shown in FIG. 8, electrons generated under the gate region of the MOS transistor and the under high concentration P-type impurity region 24 in response to the inclined incident light 62, are accumulated in the photodiode, and therefore, the electrons reaching the CCD channel is suppressed or minimized. Accordingly, the smear phenomenon is reduced, and the sensitivity is increased.

In the construction shown in FIG. 8, furthermore, since no N-type impurity region constituting the photodiode is formed under the CCD channel, the drop of the voltage applied to the CCD channel which was the problem in the prior art, can be ignored. In addition, since the characteristics of the transistor for transferring the electric charge accumulated in the photodiode to the CCD channel can be designed in the conventional manner, it is possible to control the transfer gate transfer.

Figure 9:
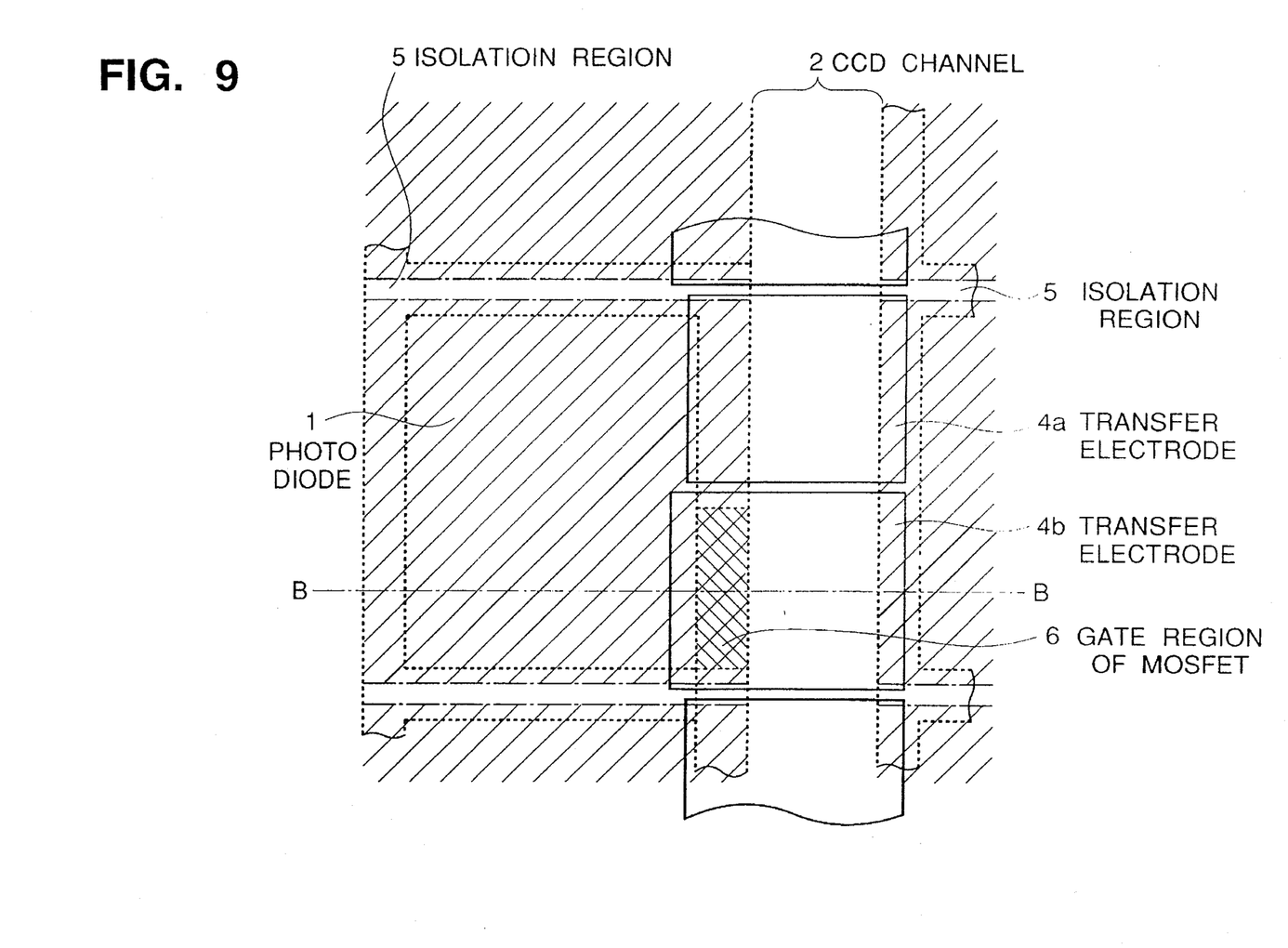
FIG. 9 is a partial enlarged layout pattern diagram of a portion including one photodiode and the CCD channel, of the solid state image sensor shown in FIG. 8.

Referring to FIG. 9, there is shown a partial enlarged layout pattern diagram of a portion including one photodiode and the CCD channel, of the solid state image sensor shown in FIG. 8.

In FIG. 8, Reference Numeral 1 designates a photodiode, and Reference Numeral 2 indicates a CCD channel. Reference Numerals 4a and 4b show one pair of transfer electrodes, and Reference Numeral 5 depicts an isolation region. Reference Numeral 6 designates a gate region of the transfer MOS transistor.

The photodiode 1 indicated by a hatched zone extends under the isolation region 5 and the gate region 6 in a horizontal direction, and also extends under the isolation region 5 in a vertical direction while maintaining a separation distance from an adjacent photodiode so that adjacent photodiode never become contact with each other.

Figure 10A:
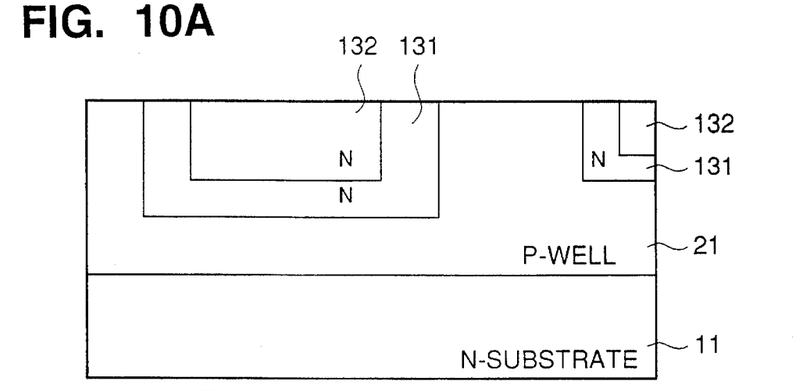
FIGS. 10A, 10B and 10C are diagrammatic sectional views illustrating a process for manufacturing the solid state image sensor shown in FIG. 8.
Figure 10B:
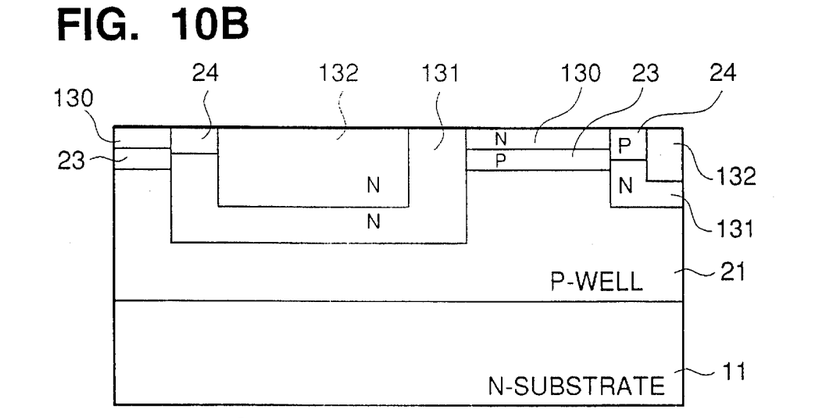
Figure 10C:
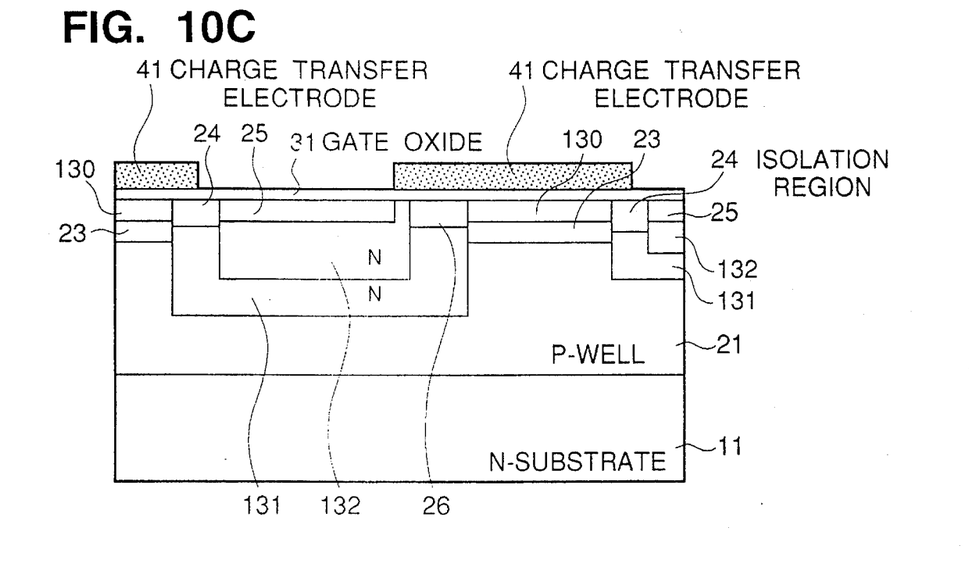

Referring to diagrammatic sectional views of FIGS. 10A, 10B and 10C, a process for manufacturing the solid state image sensor shown in FIG. 8 will be explained. In FIGS. 10A, 10B and 10C, elements similar to those shown in FIG. 8 are given the same Reference Numerals.

As shown in FIG. 10A, the P-well 21 having a thickness of 2 µm to 4 µm is formed on the principal surface of the N-type semiconductor substrate formed of for example a silicon. By using an ion implantation through a mask pattern, the first N-type impurity region 131 having a thickness of 1 µm to 2 µm is selectively formed on the P-well 21, and then, the second N-type impurity region 132 is formed within the first N-type impurity region 131.

Thereafter, as shown in FIG. 10B, by using an ion implantation, the P-type impurity region 23 having a thickness of 0.5 µm to 2 µm is selectively formed, and then, the N-type impurity layer 130 and the P-type impurity region 24 are formed.

Furthermore, the gate oxide film 31 is formed, and the P-type impurity layer 26 is formed by using an ion implantation. Then, after the electrode 41 of polysilicon is formed, the P-type impurity layer 25 having a thickness of 0.1 µm to 0.3 µm is selectively formed by using an ion implantation.

Thereafter, although not shown in the drawing, the interlayer insulating film, the light shield film, and the wiring conductors are formed so as to complete the device shown in FIG. 8.

In the above mentioned process, the forming order of the N-type impurity regions 131, 132 and 130 and the P-type impurity regions 23 and 24 are not essential to the present invention. The forming order is arbitrary.

Figure 11:
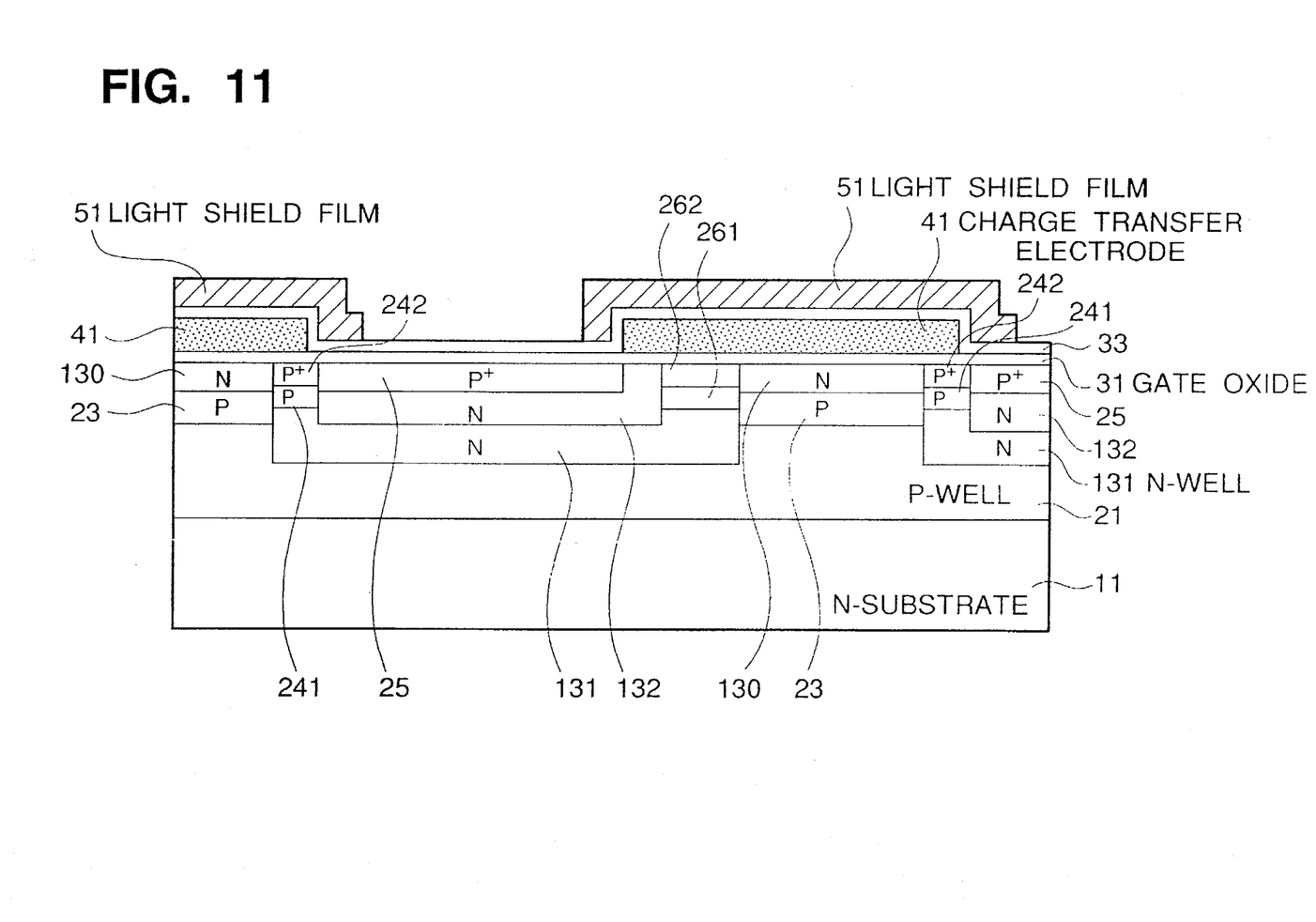
FIG. 11 is a diagrammatic sectional view of a second embodiment of the solid state image sensor in accordance with the present invention.

Referring to FIG. 11, there is shown a diagrammatic sectional view of a second embodiment of the solid state image sensor in accordance with the present invention. In FIG. 11, elements similar to those shown in FIG. 8 are given the same Reference Numerals, and explanation thereof will be omitted.

As seen from comparison between FIGS. 8 and 11, the high concentration P-type impurity region 24 for device isolation is constituted of a P-type impurity region 241 of a relatively low concentration formed at a deep level and a P-type impurity region 242 of a relatively concentration formed at a shallow level.

In this construction, the P-type impurity region 242 of a relatively high concentration is prevented from extending in the horizontal or lateral direction, and therefore, the decrease of the area of the CCD channel 130 is prevented.

Furthermore, As seen from comparison between FIGS. 8 and 11, the second embodiment is characterized in that the P-type impurity region 26 of the gate region for transferring the electric charge from the photodiode to the CCD channel is constituted of a first P-type impurity region 261 of a relatively high concentration formed at a deep level and a second P-type impurity region 262 of a relatively low concentration formed at a shallow level.

With this arrangement, a breakdown voltage between the photodiode and the CCD channel 130 is ensured, and it becomes easy to control the gate threshold of the reading or transfer transistor. This also has an advantage capable of further shortening the gate length, so that is becomes possible to increase the area of the photodiode and/or the CCD channel, namely, it becomes possible to elevate the sensitivity and the dynamic range of the device.

As seen from the above, the solid state image sensor in accordance with the present invention can elevate the electric charge collecting efficiency of the photodiode and also can reduce the amount of electrons leaking into the CCD channel, without influencing the charge transfer amount in the CCD channel. Therefore, the photoelectric conversion efficiency, namely, sensitivity can be elevated, and the smear phenomenon can be reduced or minimized.

Furthermore, since the device isolation region size and the gate length of the transfer transistor can be reduced, it is possible to further elevate the performance and to further microminiaturize the device.

In addition, it is easy to control the device since the charge transfer from the photodiode to the CCD channel is realized by the surface channel type MOS transistor. Accordingly, it is possible to increase the yield of production and therefore to reduce the manufacturing cost.

In the conventional examples shown in FIGS. 4 and 5, the high concentration P-type diffusion layer is formed on the surface of the photodiode in order to ensure that the N-type impurity layer is not in direct contact with the insulating layer, for the purpose of preventing the current occurring at the Si/SiO$_2$ boundary. In the present invention, since the area of the Si/SiO$_2$ boundary is small, the influence of the current occurring at the Si/SiO$_2$ boundary can be substantially ignored.

The invention has thus been shown and described with reference to the specific embodiments. However, it should be noted that the present invention is in no way limited to the details of the illustrated structures but changes and modifications may be made within the scope of the appended claims.

I claim:

1. A solid state image sensor, comprising:
   a) a semiconductor substrate;
   b) a well of a first conductivity type formed in the substrate:
   c) a first impurity region formed in the well and being of a second conductivity type opposite to the first conductivity type, so that a photodiode is formed by the first impurity region and the well, wherein the first impurity region includes:
      1) a first impurity sub-region having a low impurity concentration and formed at a deep level in the well; and
      2) a second impurity sub-region formed at a shallow level in the well and having an impurity concentration higher than that of the first impurity sub-region;
   d) a second impurity region surrounding and confining the first impurity region for device isolation;
   e) a CCD channel including:
      1) a first impurity layer of the first conductivity type formed in the well; and
      2) a second impurity layer of the second conductivity type formed on the first impurity layer; and
   f) a third impurity region of the first conductivity type coupling the photodiode to the CCD channel, the third impurity region formed between the first impurity region and the second impurity layer and constituting a channel region for a transistor for transferring an electric charge from the photodiode to the CCD channel;
   wherein the first impurity sub-region extends under both the second impurity region and the third impurity region.

2. The solid state image sensor of claim 1, wherein the third impurity region is formed of:
   a first impurity diffusion sub-region of a relatively high concentration formed at a deep level; and
   a second impurity diffusion sub-region of a relatively low concentration formed at a shallow level.

3. The solid state image sensor of claim 2, wherein the second impurity region is formed of:
   a third impurity diffusion sub-region of a low impurity concentration formed at a deep level; and
   a fourth impurity diffusion sub-region of a high impurity concentration formed at a shallow level.

4. A solid state image sensor, comprising:
   a) an N-type semiconductor substrate having a principal surface;
   b) a P-type well formed in the substrate;
   c) an N-type first impurity region formed in the well so that a photodiode is formed by the first impurity region and the well, wherein the first impurity region includes:
      1) an N-type first sub-region having a low impurity concentration and formed at a deep level in the well; and
      2) an N-type second sub-region formed at a shallow level in the well and having an impurity concentration higher than that of the first impurity sub-region;
   d) a P+ type second impurity region surrounding and confining the first impurity region for device isolation;
   e) a P+ type surface impurity region formed on a portion of the first impurity region at the substrate's principal surface, so that one end of the first impurity region still reaches the substrate's principal surface;
   f) a CCD channel including:
      1) a P-type first impurity layer formed in the well; and
      2) an N-type second impurity layer formed on the first impurity layer and at the substrate's principal surface;
   g) a P-type third impurity region formed at the substrate's principal surface coupling the photodiode to the CCD channel, the third impurity region formed between the first impurity region and the second impurity layer and constituting a channel region for a transistor for transferring an electric charge from the photodiode to the CCD channel;
   h) an insulating film covering the substrate's principal surface;
   i) a charge transfer electrode formed on the insulating film and extending from an end of the first impurity region, over the third impurity region and the second impurity layer, to reach a portion of the second impurity region; and
   j) a light shield film covering the charge transfer electrode to prevent light from entering the CCD channel;
   wherein the first sub-region extends under both the second impurity region and the third impurity region.

5. The solid state image sensor of claim 4, wherein the third impurity region is formed of:
   a P-type first diffusion sub-region of a relatively high concentration formed at a deep level; and
   a P-type second diffusion sub-region of a relatively low concentration formed at a shallow level.

6. The solid state image sensor of claim 5, wherein the second impurity region is formed of:
   a P-type third diffusion sub-region of a low impurity concentration formed at a deep level; and
   a P+ type fourth diffusion sub-region of a high impurity concentration formed at a shallow level.

* * * * *